(12) United States Patent
Qian et al.

(10) Patent No.: US 8,569,856 B2
(45) Date of Patent: Oct. 29, 2013

(54) PAD DESIGN FOR CIRCUIT UNDER PAD IN SEMICONDUCTOR DEVICES

(75) Inventors: Yin Qian, Milpitas, CA (US);
Hsin-Chih Tai, San Jose, CA (US);
Keh-Chiang Ku, Cupertino, CA (US);
Vincent Venezia, Los Gatos, CA (US);
Duli Mao, Sunnyvale, CA (US); Wei Zheng, Los Gatos, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 142 days.

(21) Appl. No.: 13/288,731

(22) Filed: Nov. 3, 2011

(65) Prior Publication Data

US 2013/0113065 A1      May 9, 2013

(51) Int. Cl.
*H01L 21/00*      (2006.01)

(52) U.S. Cl.
USPC ............................. 257/459; 257/460; 257/437

(58) Field of Classification Search
USPC .......................................... 257/459, 437, 460
See application file for complete search history.

(56) References Cited

U.S. PATENT DOCUMENTS

| | | | | | |
|---|---|---|---|---|---|
| 6,043,144 | A * | 3/2000 | Kuo | ............................. | 438/612 |
| 6,472,698 | B1 * | 10/2002 | Nakashiba | .................... | 257/222 |
| 6,872,584 | B2 * | 3/2005 | Nakashiba | ...................... | 438/22 |
| 7,101,726 | B2 * | 9/2006 | Yamamoto et al. | ............. | 438/69 |
| 7,545,423 | B2 * | 6/2009 | Park et al. | ...................... | 348/294 |
| 8,344,471 | B2 * | 1/2013 | Tseng et al. | ................... | 257/459 |
| 8,456,856 | B2 * | 6/2013 | Lin et al. | ........................ | 361/783 |
| 2008/0029761 | A1 * | 2/2008 | Peng | ............................. | 257/43 |
| 2009/0032893 | A1 * | 2/2009 | Weng et al. | ..................... | 257/432 |
| 2010/0006963 | A1 * | 1/2010 | Brady | ............................ | 257/432 |
| 2010/0246152 | A1 * | 9/2010 | Lin et al. | ........................ | 361/783 |
| 2011/0024866 | A1 * | 2/2011 | Tseng et al. | ................... | 257/459 |
| 2011/0024867 | A1 * | 2/2011 | Tseng et al. | ................... | 257/459 |
| 2011/0115073 | A1 * | 5/2011 | Chen | ............................. | 257/737 |
| 2011/0164103 | A1 * | 7/2011 | Kii | ................................ | 347/118 |
| 2011/0221018 | A1 * | 9/2011 | Shi et al. | ........................ | 257/432 |
| 2012/0280402 | A1 * | 11/2012 | Pagaila et al. | ................. | 257/774 |
| 2012/0280403 | A1 * | 11/2012 | Pagaila et al. | ................. | 257/774 |
| 2012/0326329 | A1 * | 12/2012 | Tay et al. | ....................... | 257/774 |
| 2013/0020700 | A1 * | 1/2013 | Liu et al. | ....................... | 257/737 |
| 2013/0113065 | A1 * | 5/2013 | Qian et al. | .................... | 257/437 |

* cited by examiner

*Primary Examiner* — Laura Menz
(74) *Attorney, Agent, or Firm* — Blakely Sokoloff Taylor & Zafman LLP (57) ABSTRACT

Embodiments of a semiconductor device that includes a semiconductor substrate and a cavity disposed in the semiconductor substrate that extends at least from a first side of the semiconductor substrate to a second side of the semiconductor substrate. The semiconductor device also includes an insulation layer disposed over the first side of the semiconductor substrate and coating sidewalls of the cavity. A conductive layer including a bonding pad is disposed over the insulation layer. The conductive layer extends into the cavity and connects to a metal stack disposed below the second side of the semiconductor substrate. A through silicon via pad is disposed below the second side of the semiconductor substrate and connected to the metal stack. The through silicon via pad is position to accept a through silicon via.

10 Claims, 8 Drawing Sheets

PAD DESIGN FOR CIRCUIT UNDER PAD IN SEMICONDUCTOR DEVICES

TECHNICAL FIELD

This disclosure relates generally to semiconductors devices, and in particular, but not exclusively to pad structures for integrated circuits.

BACKGROUND INFORMATION

Semiconductor devices such as integrated circuits ("IC") or chips are formed with a plurality of bonding pads on the surface, and provide an on-chip interface to electrically couple signals on the semiconductor devices to external pins off-chip. As the size of ICs decrease with advancing technology, the pad size and pitch do not decrease at the same rate. Consequently, a greater percentage of area on an IC is taken up by bonding pads and their related structures.

Figure 1A:
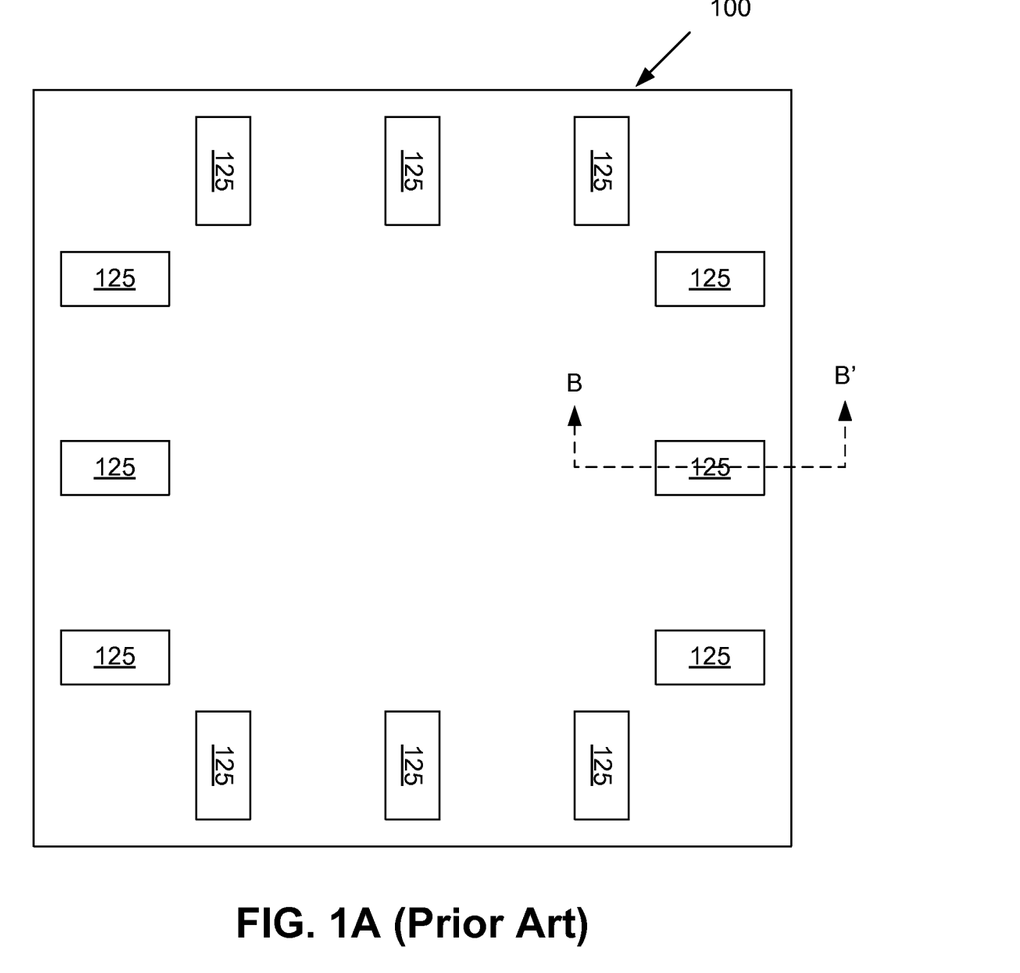
FIG. 1A is a plan bottom view of a conventional integrated circuit, showing bonding pads.
Figure 1B:
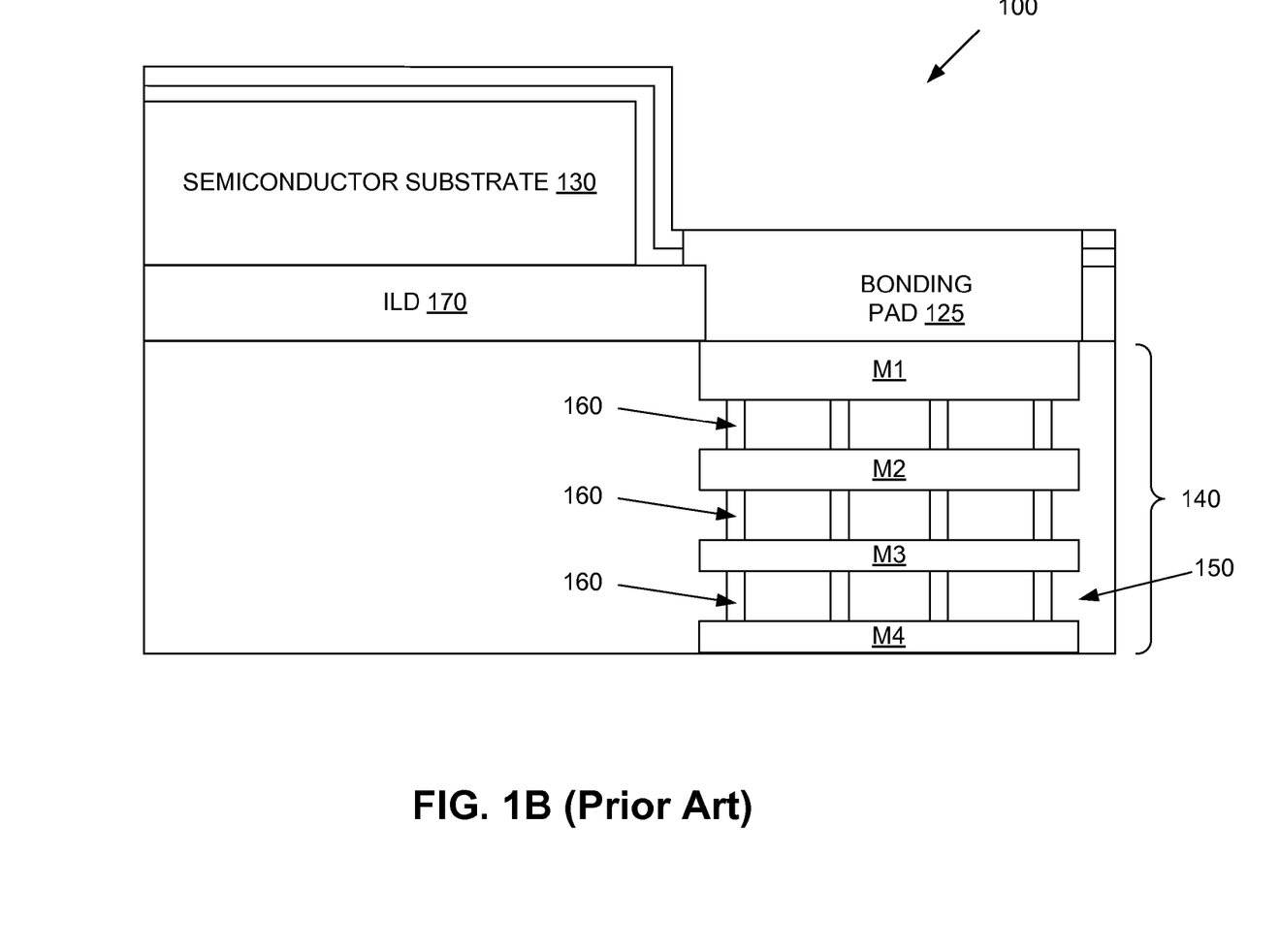
FIG. 1B is a cross-sectional view through line 1B-1B' of a portion of the conventional integrated circuit in FIG. 1A.

FIG. 1A is a plan bottom view of conventional IC 100 which includes bonding pads 125. FIG. 1B is a cross-sectional view of a portion of IC 100 and one bonding pad 125. IC 100 includes bonding pads 125, semiconductor substrate 130, and metal stack 140. Metal stack 140 includes metal interconnect layers M1, M2, M3, and M4 formed within dielectric layer 150. Contacts 160 couple one metal interconnect layer of metal stack 140 to another metal interconnect layer. Inter-layer dielectric ("ILD") 170 isolates semiconductor substrate 130 from metal stack 140.

One drawback of the above-described bonding pad structure is that a large portion of semiconductor substrate 130 is removed to accommodate bonding pad 125. Therefore, there is a reduced amount of semiconductor substrate 130 for circuit formation. With the percentage of area of an IC taken up by bonding pads increasing, bonding pad structures capable of supporting circuits under the bonding pad are needed.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a semiconductor device and methods of manufacture for a semiconductor device are described herein. In the following description, numerous specific details are set forth to provide a thorough understanding of the embodiments. One skilled in the relevant art will recognize, however, that the techniques described herein can be practiced without one or more of the specific details, or with other components, materials, etc. In other instances, well-known structures, materials or operations are not shown or described in detail to avoid obscuring certain aspects.

References throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Directional terminology such as top, bottom, down, and over are used with reference to the orientation of the figure(s) being described, but should not be interpreted as any kind of limitation on the orientation of the embodiment.

As used herein, the term "substrate" refers to any of a variety of substrates formed using semiconductor material— e.g. based upon silicon, silicon-germanium, germanium, gallium arsenide and/or the like. A substrate layer may include such a substrate and one or more structures resulting from operations that have been performed upon the substrate—e.g. such operations forming regions, junctions and/or other structures in the substrate. By way of illustration and not limitation, such structures may include one or more of doped semiconductor regions and/or undoped semiconductor regions, epitaxial layers of silicon, and other semiconductor structures formed upon the substrate.

Figure 2A:
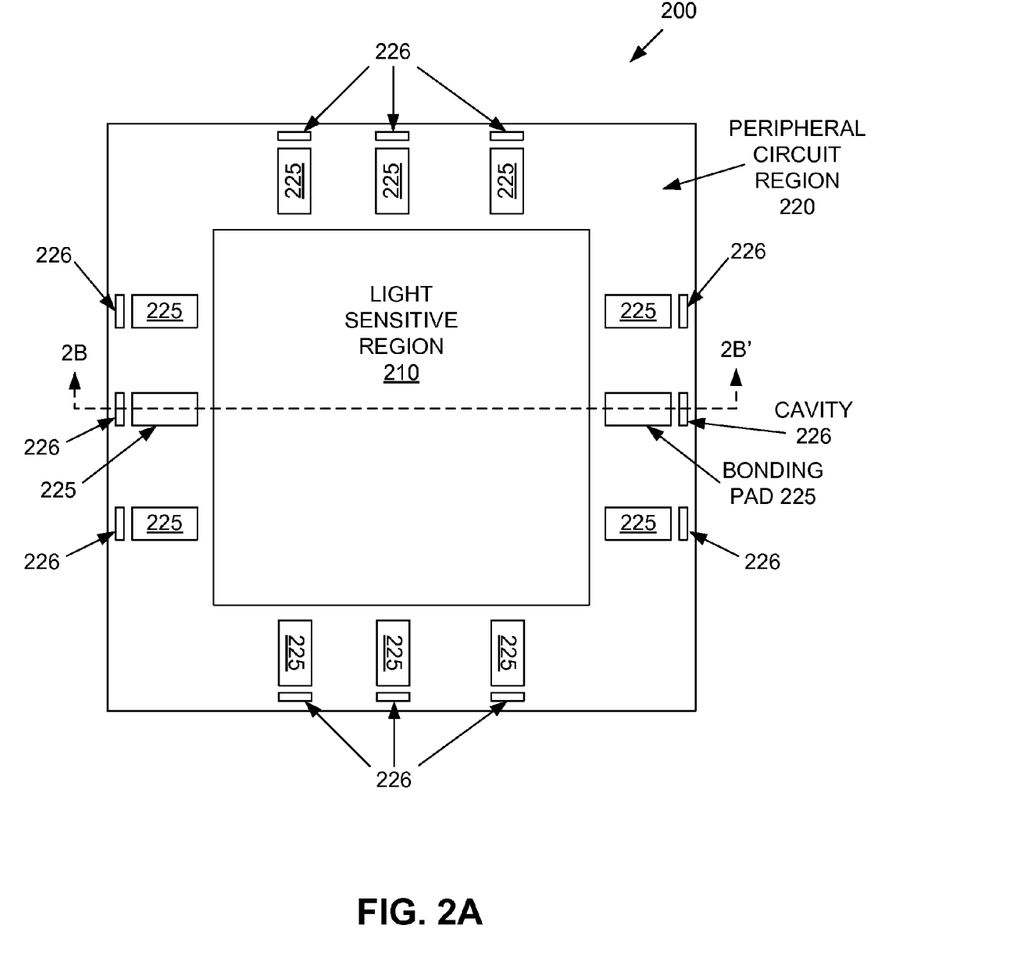
FIG. 2A is a plan view illustrating a planar bottom of an integrated circuit showing bonding pads, in accordance with an embodiment of the disclosure.

FIG. 2A is a plan view illustrating a planar bottom of an integrated circuit and multiple bonding pads, in accordance with an embodiment of the invention. In FIG. 2A, a back-side illuminated ("BSI") image sensor 200 is illustrated as one example of an integrated circuit ("IC"). In BSI image sensor 200, photosensitive regions disposed in the substrate of an image sensor pixel array are exposed to incident light from the back-side of the substrate. In other embodiments of the disclosure, the IC may be a front-side illuminated ("FSI") image sensor or some other type of electronic circuit.

In the illustrated embodiment, BSI image sensor 200 includes light sensitive region 210 surrounded by peripheral circuit region 220. Bonding pads (e.g. bonding pad 225) and cavities (e.g. cavity 226) may be located in peripheral circuit region 220 so that they do not block incident light from light sensitive region 210. Light sensitive region 210 may contain an image sensor pixel array. In the illustrated embodiment, cavity 226 is located on an outside perimeter of peripheral circuit region 220 to increase useable semiconductor substrate area. In other embodiments, cavity 226 is closer to light sensitive region 210 than bonding pad 225. Bonding pad 225 makes signals inside BSI image sensor 200 externally available through wire bond connection.

Figure 2B:
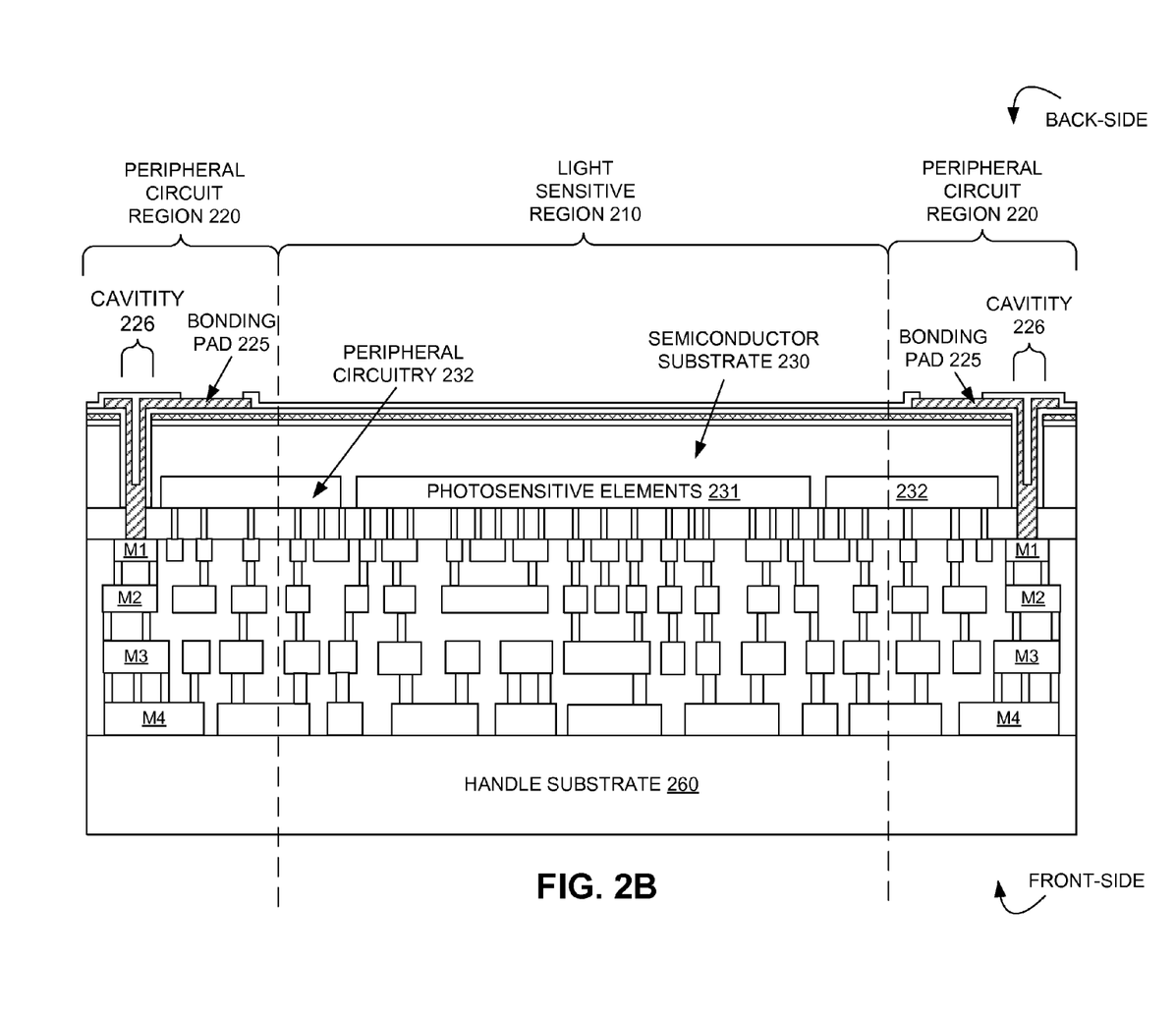
FIG. 2B is a cross-sectional view through line 2B-2B' of the integrated circuit in FIG. 2A, in accordance with an embodiment of the disclosure.

FIG. 2B is a cross-sectional view of BSI image sensor 200 taken along line 2B-2B' in FIG. 2A. The illustrated embodiment of BSI image sensor 200 includes bonding pad 225, cavity 226, semiconductor substrate 230, photosensitive elements 231, peripheral circuitry 232, and handle substrate 260. Bonding pad 225 and cavity 226 may be formed on the back-side of semiconductor substrate 230. Semiconductor substrate 230 may be P-type and may be referred to as an epitaxial layer or "epi layer". Photosensitive elements 231 formed on the front-side of semiconductor substrate 230 represent where an image sensor pixel array may be disposed. Photosensitive elements 231 may include a photodiode and a transfer gate. Peripheral circuitry 232, also illustrated as formed on the front-side of semiconductor substrate 230, may include control circuitry, function logic circuitry, and readout circuitry associated with photosensitive elements 231. Peripheral circuitry 232 may reside exclusively in peripheral circuit region 220 or reside in both peripheral circuit region 220 and light sensitive region 210. In one embodiment, photosensitive elements 231 are N-type. However, persons skilled in the art will appreciate that in other embodiments, the doping polarity may be different. For example, photosensitive elements 231 may be P-type while semiconductor substrate 230 may be N-type.

Figure 2C:
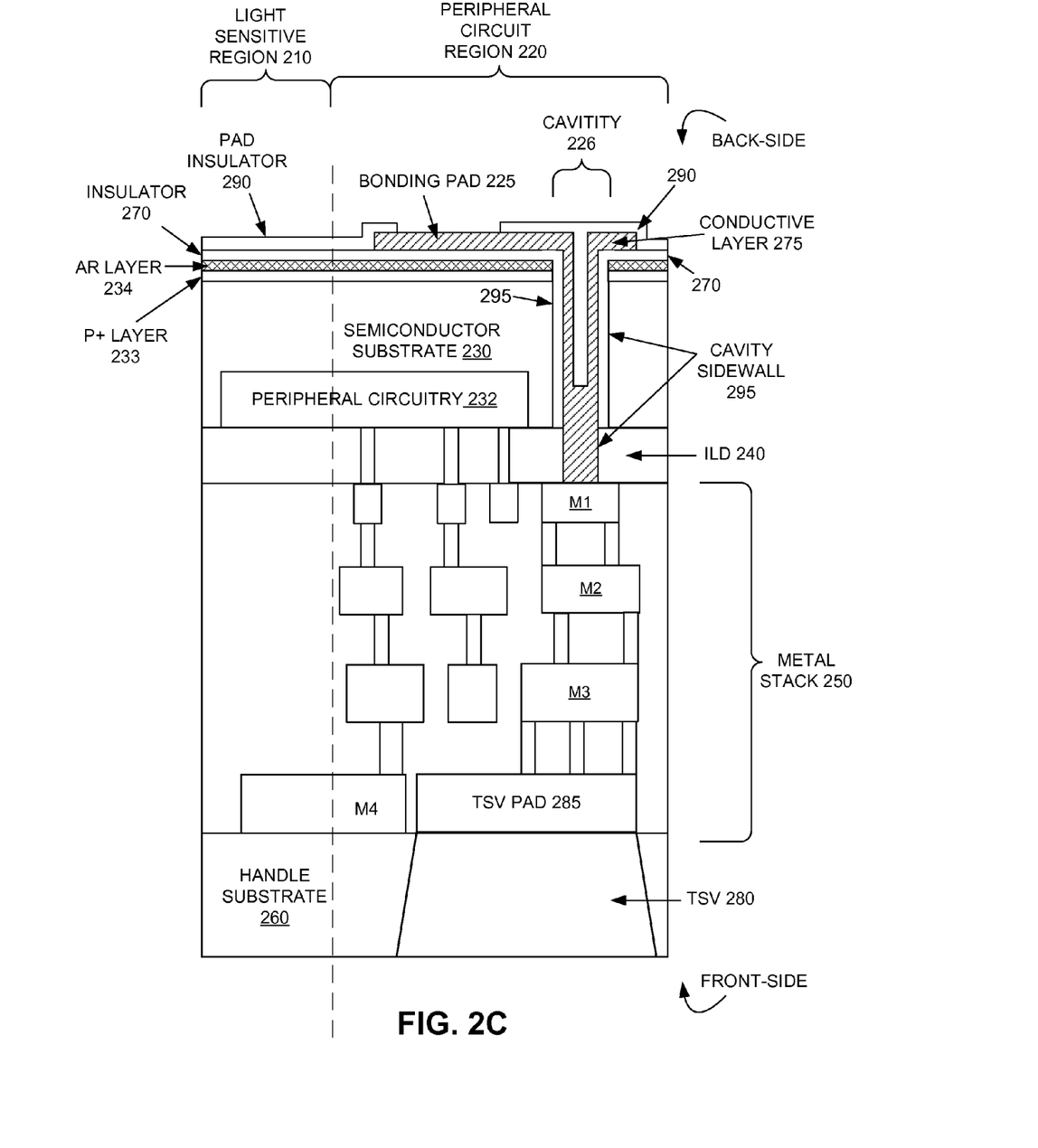
FIG. 2C is a cross-sectional view through a portion of line 2B-2B' illustrating the integrated circuit in FIG. 2A in greater detail, in accordance with an embodiment of the disclosure.

FIG. 2C is a cross-sectional view through a portion of line 2B-2B' illustrating BSI image sensor 200 in greater detail than FIG. 2B. FIG. 2C illustrates P+ layer 233, anti-reflective ("AR") layer 234, insulator 270, conductive layer 275, pad insulator 290, cavity sidewall 295, and inter-layer dielectric ("ILD") layer 240. P+ layer 233 is disposed on the back-side of semiconductor substrate 230, and anti-reflective ("AR") layer 234 is disposed over P+ dopant layer 233. In the illustrated embodiment, insulator 270 is disposed over AR layer 234, and insulator 270 also coats cavity sidewall 295. In one embodiment, conductive layer 275 is disposed over insulator 270 and conductive layer 275 also extends into cavity 226. Bonding pad 225 is the portion of conductive layer 275 disposed over semiconductor substrate 230. Pad insulator 290 may be disposed over portions of conductive layer 275, but at least a portion of bonding pad 225 will be exposed. Insulator 270 coating cavity sidewall 295 may electrically isolates the portion of conductive layer 275 disposed in the cavity from semiconductor substrate 230.

Cavity 226 is disposed in semiconductor substrate 230 in peripheral circuit region 220, in the illustrated embodiment. Cavity 226 may be etched in semiconductor substrate 230 or formed using a different process. Cavity 226 extends at least from the back-side of semiconductor substrate 230 to the front-side of semiconductor substrate 230. Cavity 226 may also extend through an ILD layer 240. In the illustrated embodiment, ILD layer 240 is disposed between semiconductor substrate 230 and metal stack 250. A portion of conductive layer 275 (the portion disposed at the bottom of cavity 226) connects to metal stack 250. This connection creates a conductive electrical path between bonding pad 225 and metal stack 250.

FIG. 2C illustrates metal stack 250, disposed on the front side of substrate 230 as including metal interconnect layers M1, M2, M3, and M4. In some embodiments, metal stack 250 may contain any number of metal interconnect layers. The metal interconnect layers may be formed between an inter-metal dielectric and be connected together by contacts. Photosensitive elements 231 and peripheral circuitry 232 may be electrically connected to metal stack 250.

M4, a metal interconnect layer disposed on the front side of substrate 230, is illustrated as being disposed over and contacting handle substrate 260. TSV pad 285 may be included in M4 or another metal interconnect layer. TSV pad 285 may be silicon and is positioned to accept a TSV. TSV pad 285 may be positioned to distribute signals off-chip or receive off-chip signals. In one embodiment, TSV 285 pad is positioned to maximize the availability of metal interconnect layers (e.g. M1, M2, and M3) directly below bonding pad 225 in order to allow for metal interconnect layers to connect to the circuitry (e.g. peripheral circuitry 232) directly below bonding pad 225. In the illustrated embodiment, TSV 280 runs through handle substrate 260 and connects with TSV pad 285. In some embodiments, all or part of handle substrate 260 is removed from BSI image sensor 200. TSV 280 may run through a substrate other than handle substrate 260.

TSV pad 285 allows metal stack 250 and any circuitry connected to metal stack 250 (e.g. photosensitive elements 231 and peripheral circuitry 232) to be accessed from the front-side of BSI image sensor 200 by a via (e.g. TSV 280) and bonding pad 225 allows metal stack 250 to be accessed from the back-side by wire bond. Furthermore, having cavity 226 disposed on an outside perimeter of peripheral circuit region 220 allows semiconductor substrate to remain continuous for a larger area. And, since bonding pad 225 is connected to metal stack 250 by the portion of conductive layer 275 that is disposed in the cavity, circuitry under pad ("CUP") is possible. In contrast, bonding pad 125 in conventional IC 100 requires removal of a larger portion of semiconductor substrate 130 and no CUP is possible. Hence, the illustrated embodiment allows for increased semiconductor substrate to hold circuitry while still allowing wire bond access (through bonding pad 225) and TSV access (by position of TSV pad 285). Although the illustrated embodiment is of BSI image sensor 200, the disclosure could apply to other ICs.

Figure 3:
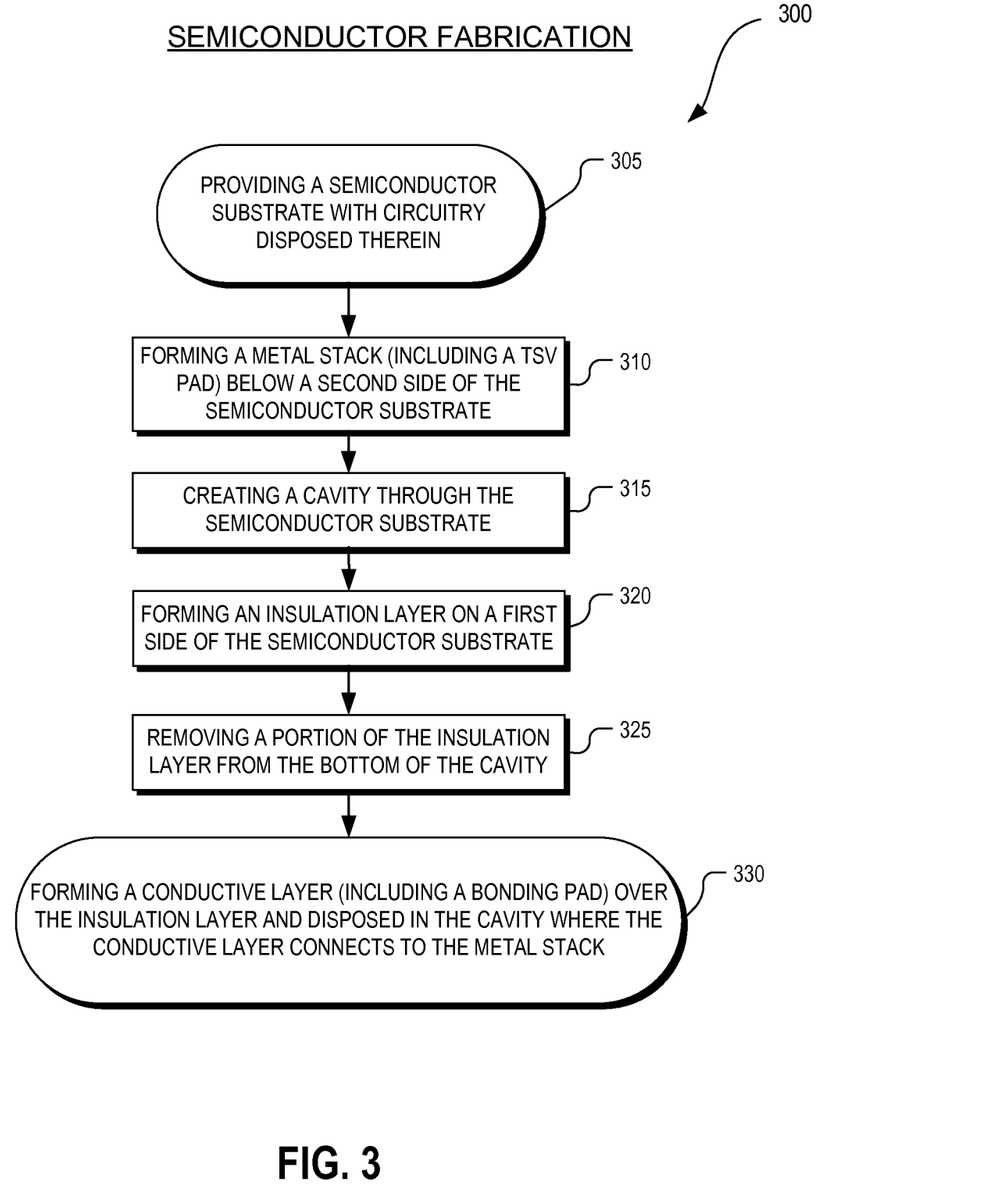
FIG. 3 is a flow chart illustrating a process for manufacturing a semiconductor, in accordance with an embodiment of the disclosure.

FIG. 3 is a flow chart illustrating a process for manufacturing a semiconductor, in accordance with an embodiment of the invention. Process 300 is one example of how to fabricate BSI image sensor 200. The order in which some or all of the process blocks appear in each process should not be deemed limiting. Rather, one of ordinary skill in the art having the benefit of the present disclosure will understand that some of the process blocks may be executed in a variety of orders not illustrated, or even in parallel.

In process block 305, a semiconductor substrate (e.g. semiconductor substrate 230) with circuitry (e.g. peripheral circuitry 232) disposed in it is provided. In process block 310, a metal stack (e.g. metal stack 250) including a TSV pad (e.g. TSV pad 285) is formed on a second side of the semiconductor substrate. A cavity (e.g. cavity 226) is created through semiconductor substrate at process block 315. The cavity may extend past the semiconductor substrate through other layers until the cavity reaches the metal stack. The cavity may be formed using known etch processes such as dry etching. At process block 320, an insulation layer (e.g. insulation 270) is formed on a first side of the semiconductor substrate. The insulation layer may also be formed on the sidewalls of the cavity and at the bottom of the cavity. The bottom of the cavity (where the cavity connects to the metal stack) may be opposite of the first side of the semiconductor substrate. A portion of the insulation layer at the bottom of the cavity is removed at process block 325. The insulation layer at the bottom of the cavity is removed so that a conductive layer may connect with the metal stack. At process block 330, a conductive layer (which includes a bonding pad) is formed above the insulation layer and is also disposed in the cavity. The conductive layer is disposed so that the conductive layer connects to the metal stack.

Figure 4:
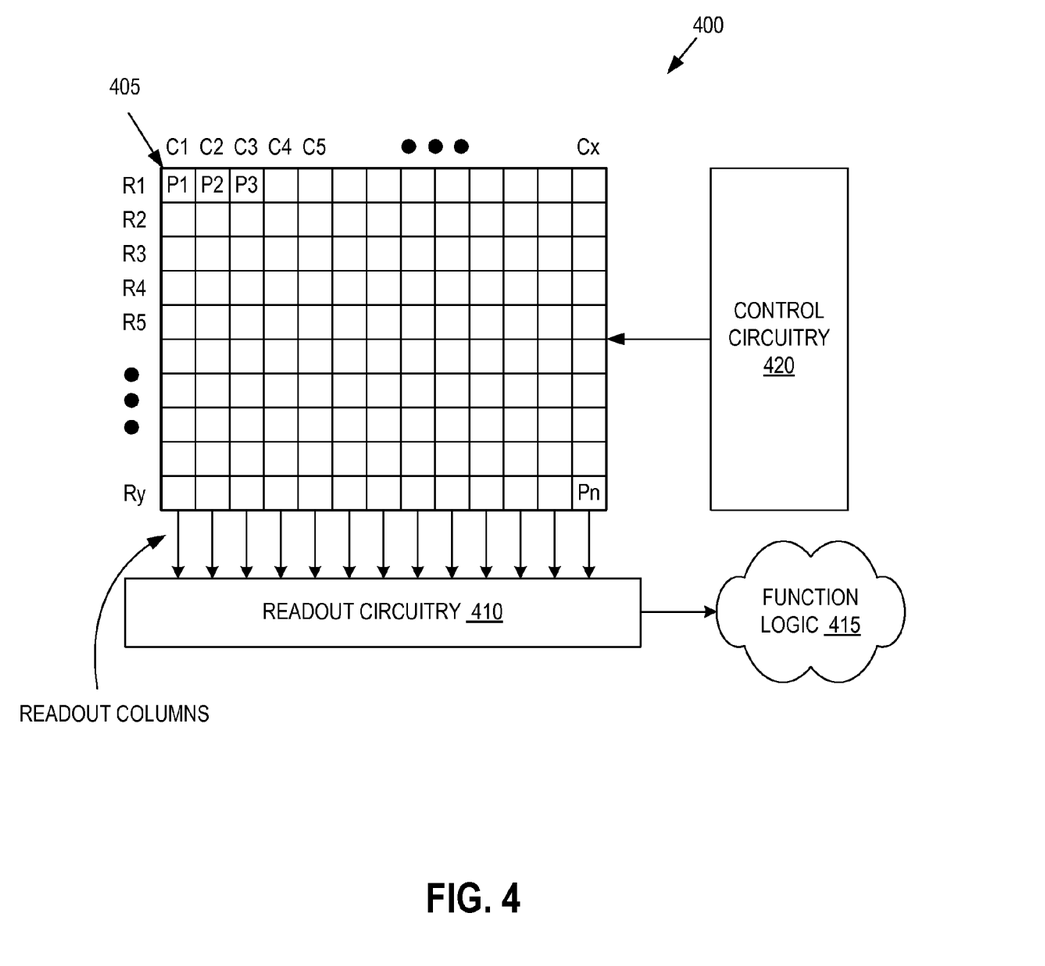
FIG. 4 is a functional block diagram illustrating an imaging sensor, in accordance with an embodiment of the disclosure.

FIG. 4 is a functional block diagram illustrating an imaging sensor 400, in accordance with an embodiment of the disclosure. Imaging sensor 400 is one possible implementation of an IC implemented using the techniques described herein. The illustrated embodiment of imaging sensor 400 includes pixel array 405, readout circuitry 410, function logic 415, and control circuitry 420. Pixel array 405 is a two-dimensional ("2D") array of imaging sensors or pixels (e.g., pixels P1, P2 ..., Pn). Pixel array 405 may be disposed in photosensitive elements 231 in light sensitive region 210. Readout circuitry 410, function logic 415, and/or control circuitry 420 may be disposed in peripheral circuitry 232. In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object. The structures and processes in this disclosure may be used in imaging sensor 400.

After each pixel has acquired its image data or image charge, the image data is read out by readout circuitry 410 and transferred to function logic 415. Readout circuitry 410 may include amplification circuitry, analog-to-digital ("ADC") conversion circuitry, or otherwise. Function logic 415 may simply store the image data or even manipulate the image data by applying post image effects (e.g., crop, rotate, remove red eye, adjust brightness, adjust contrast, or otherwise). In one embodiment, readout circuitry 410 may readout a row of image data at a time along readout column lines (illustrated) or may readout the image data using a variety of other techniques (not illustrated), such as a serial readout or a full parallel readout of all pixels simultaneously. Control circuitry 420 is coupled to pixel array 405 to control operational characteristic of pixel array 405. For example, control circuitry 420 may generate a shutter signal for controlling image acquisition.

Figure 5:
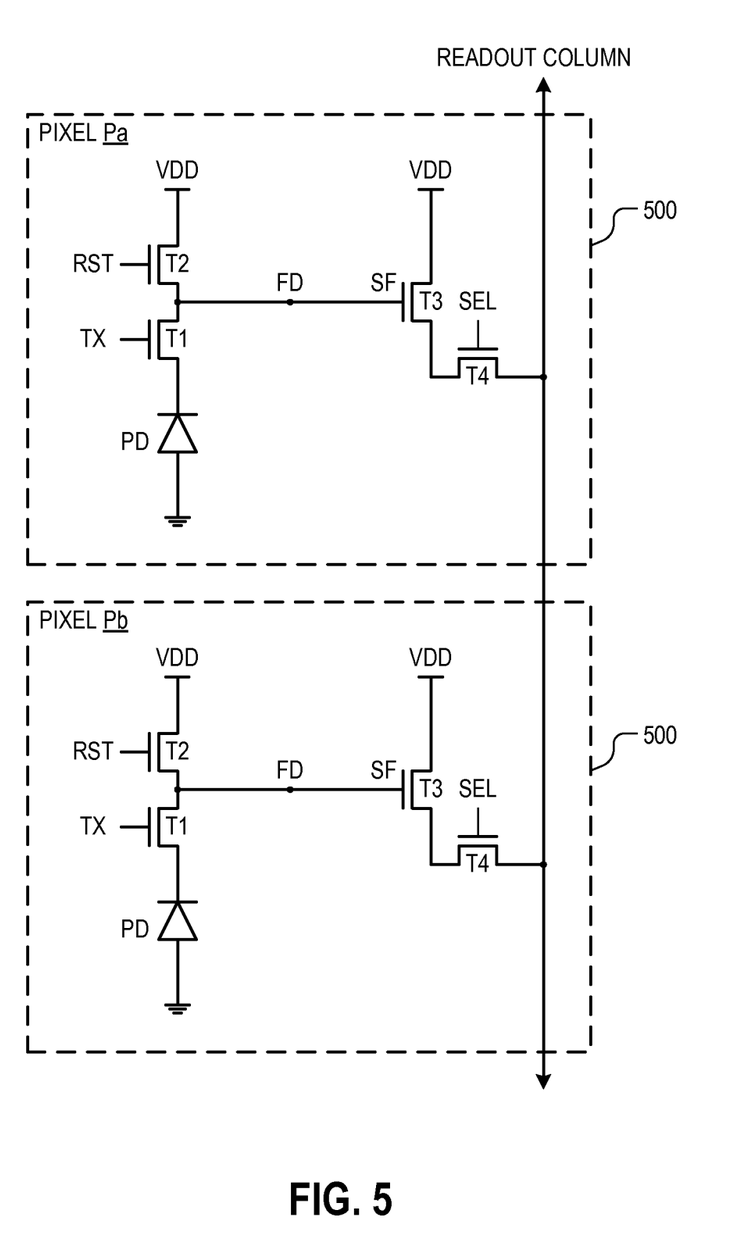
FIG. 5 is a circuit diagram illustrating sample pixel circuitry of two image sensor pixels within an image sensor, in accordance with an embodiment of the disclosure.

FIG. 5 is a circuit diagram illustrating sample pixel circuitry 500 of two four-transistor ("4T") pixels within an imaging array, in accordance with an embodiment of the invention. Pixel circuitry 500 is one possible pixel circuitry architecture for implementing each pixel within pixel array 405 of FIG. 4. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In some embodiments, some of the circuitry illustrated in pixel circuitry 500 may be disposed in peripheral circuitry 232.

In FIG. 5, pixels Pa and Pb are arranged in two rows and one column. The illustrated embodiment of each pixel circuitry 500 includes photodiode PD, transfer transistor T1, reset transistor T2, source-follower ("SF") transistor T3, select transistor T4, and storage capacitor C1. During operation, transfer transistor T1 receives transfer signal TX, which transfers the charge accumulated in photodiode PD to floating diffusion node FD. In one embodiment, floating diffusion node FD may be coupled to a storage capacitor (not shown) for temporarily storing image charges.

Reset transistor T2 is coupled between power rail VDD and the floating diffusion node FD to reset the pixel (e.g., discharge or charge the FD and the PD to a preset voltage) under control of reset signal RST. Floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 500 to the readout column line under control of select signal SEL. In one embodiment, the TX signal, the RST signal, and the SEL signal are generated by control circuitry 420.

The above description of illustrated embodiments of the invention, including what is described in the abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising:
a semiconductor substrate including a light sensitive region surrounded by a peripheral circuit region;
a cavity disposed in the peripheral circuit region of the semiconductor substrate, the cavity extending at least from a first side of the semiconductor substrate through to a second side of the semiconductor substrate;
an insulation layer disposed over the first side of the semiconductor substrate and coating sidewalls of the cavity;
a conductive layer including a bonding pad disposed over the insulation layer and over the first side of the semiconductor substrate, wherein the conductive layer extends into the cavity and connects to a metal stack disposed below the second side of the semiconductor substrate; and
a through silicon via ("TSV") pad disposed below the second side of the semiconductor substrate and connected to the metal stack, wherein the TSV pad is positioned to accept a TSV.

2. The image sensor of claim 1, further comprising:
photosensitive elements disposed in the light sensitive region of the semiconductor substrate; and
readout circuitry disposed under the bonding pad and disposed in the peripheral circuit region of the semiconductor substrate, wherein the readout circuitry is coupled to readout image data from the photosensitive elements.

3. The image sensor of claim 1, further comprising:
a handle substrate disposed below the TSV pad; and
a TSV running through the handle substrate and connecting with the TSV pad.

4. The image sensor of claim 1, further comprising:
an inter-layer dielectric disposed between the metal stack and the semiconductor substrate, wherein the cavity extends through the inter-layer dielectric.

5. The image sensor of claim 1, further comprising:
an anti-reflective layer disposed over photosensitive elements disposed in the light sensitive region of the semiconductor substrate.

6. The image sensor of claim 1, wherein the cavity is on an outside perimeter of the peripheral circuit region of the semiconductor substrate.

7. The image sensor of claim 1, wherein the metal stack includes a plurality of metal interconnect layers, and wherein at least a portion of the TSV pad is disposed directly below at least one metal interconnect layer in the metal stack, the at least one metal interconnect layer disposed directly below and connected to circuitry disposed directly below the bonding pad.

8. The image sensor of claim 1, wherein the entire bonding pad is disposed above and over the peripheral circuit region.

9. The image sensor of claim 1, wherein the metal stack includes the TSV pad.

10. The image sensor of claim 1, wherein the TSV pad is positioned for distributing or receiving off-chip signals.

* * * * *